United States Patent
Brazzle et al.

(10) Patent No.: US 11,749,576 B2
(45) Date of Patent: Sep. 5, 2023

(54) STACKED CIRCUIT PACKAGE WITH MOLDED BASE HAVING LASER DRILLED OPENINGS FOR UPPER PACKAGE

(71) Applicant: Analog Devices International Unlimited Company, Limerick (IE)

(72) Inventors: John D. Brazzle, Tracy, CA (US); Frederick E. Beville, San Jose, CA (US); David R. Ng, San Jose, CA (US); Michael J. Anderson, Peabody, MA (US); Yucheng Ying, San Jose, CA (US)

(73) Assignee: Analog Devices International Unlimited Company, Limerick (IE)

( * ) Notice: Subject to any disclaimer, the term of this patent is extended or adjusted under 35 U.S.C. 154(b) by 70 days.

(21) Appl. No.: 17/033,245

(22) Filed: Sep. 25, 2020

(65) Prior Publication Data
US 2021/0111084 A1 Apr. 15, 2021

Related U.S. Application Data

(63) Continuation of application No. PCT/US2019/021908, filed on Mar. 12, 2019, which
(Continued)

(51) Int. Cl.
*H01L 23/48* (2006.01)
*H01L 23/31* (2006.01)
(Continued)

(52) U.S. Cl.
CPC ......... *H01L 23/3128* (2013.01); *H01F 27/29* (2013.01); *H01L 21/56* (2013.01);
(Continued)

(58) Field of Classification Search
CPC ......... H01L 23/48; H01L 27/29; H01L 21/56; H01L 23/49827
(Continued)

(56) References Cited

U.S. PATENT DOCUMENTS 4,089,041 A 5/1978 Lockard
4,739,125 A 4/1988 Watanabe et al.
(Continued)

FOREIGN PATENT DOCUMENTS

CN 101495014 7/2009
CN 102088241 6/2011
(Continued)

OTHER PUBLICATIONS

US 10,643,959 B2, 05/2020, Moussaouni et al. (withdrawn)
(Continued)

*Primary Examiner* — Nitin Parekh
(74) *Attorney, Agent, or Firm* — Knobbe Martens Olson & Bear LLP

(57) ABSTRACT

A stacked package configuration is described that includes a bottom package and an upper package. The bottom package includes a substrate having a top surface with first circuitry and metal first pads. A molded layer is then formed over the substrate. Holes through the molded layer are then laser drilled to expose the first pads. The holes and first pads align with leads of an upper package, which contains further circuit components. The holes are then partially filled with a solder paste. A thermal epoxy is applied between the molded layer and the upper package. The leads of the upper package are then inserted into the holes, and the solder paste is reflowed to electrically, thermally, and mechanically connect the upper package to the bottom package. The reflow heat also cures the epoxy. A ball grid array is then formed on the bottom of the substrate.

19 Claims, 8 Drawing Sheets

Related U.S. Application Data is a continuation of application No. 16/152,182, filed on Oct. 4, 2018, now Pat. No. 10,497,635.

(60) Provisional application No. 62/648,835, filed on Mar. 27, 2018.

(51) Int. Cl.

| | | |
|---|---|---|
| *H01F 27/29* | (2006.01) | |
| *H01L 21/56* | (2006.01) | |
| *H01L 23/367* | (2006.01) | |
| *H01L 23/498* | (2006.01) | |
| *H01L 25/16* | (2023.01) | |
| *H01L 25/07* | (2006.01) | |
| *H01L 21/48* | (2006.01) | |

(52) U.S. Cl.
CPC .... *H01L 23/3677* (2013.01); *H01L 23/49827* (2013.01); *H01L 25/072* (2013.01); *H01L 25/16* (2013.01); *H01L 21/4853* (2013.01)

(58) Field of Classification Search
USPC .......................................... 257/690, 697, 787
See application file for complete search history.

(56) References Cited

U.S. PATENT DOCUMENTS

| | | | |
|---|---|---|---|
| 4,801,912 A | 1/1989 | McElheny et al. | |
| 4,862,246 A | 8/1989 | Masuda et al. | |
| 4,914,259 A | 4/1990 | Kobayashi et al. | |
| 5,343,075 A | 8/1994 | Nishino | |
| 5,485,037 A | 1/1996 | Marrs | |
| 5,514,907 A | 5/1996 | Moshayedi | |
| 5,535,101 A | 7/1996 | Miles et al. | |
| 5,647,124 A | 7/1997 | Chan et al. | |
| 5,706,172 A | 1/1998 | Lee | |
| 5,804,880 A | 9/1998 | Mathew | |
| 5,932,927 A | 8/1999 | Koizumi et al. | |
| 6,415,504 B1 | 7/2002 | Matsuda | |
| 6,727,579 B1 * | 4/2004 | Eldridge | H01L 24/72 |
| | | | 257/E23.024 |
| 7,129,420 B2 | 10/2006 | Hashimoto | |
| 7,683,473 B2 | 3/2010 | Kasai et al. | |
| 7,838,334 B2 | 11/2010 | Yu et al. | |
| 7,939,934 B2 * | 5/2011 | Haba | H05K 3/3436 |
| | | | 257/737 |
| 7,977,773 B1 | 7/2011 | Cusack | |
| 7,982,139 B2 | 7/2011 | Kariya et al. | |
| 8,156,634 B2 | 4/2012 | Gallup et al. | |
| 8,193,034 B2 | 6/2012 | Pagaila et al. | |
| 8,203,164 B2 | 6/2012 | Min et al. | |
| 8,241,956 B2 | 8/2012 | Camacho et al. | |
| 8,258,010 B2 | 9/2012 | Pagaila et al. | |
| 8,283,750 B2 | 10/2012 | Guiraud et al. | |
| 8,349,657 B2 | 1/2013 | Do et al. | |
| 8,349,721 B2 | 1/2013 | Shim et al. | |
| 8,383,457 B2 | 2/2013 | Pagaila et al. | |
| 8,409,922 B2 | 4/2013 | Camacho et al. | |
| 8,445,990 B2 | 5/2013 | Lin et al. | |
| 8,502,387 B2 | 8/2013 | Choi et al. | |
| 8,513,812 B2 | 8/2013 | Lin | |
| 8,525,340 B2 | 9/2013 | Eckhardt et al. | |
| 8,525,344 B2 | 9/2013 | Pagaila et al. | |
| 8,530,274 B2 | 9/2013 | Pagaila | |
| 8,563,418 B2 | 10/2013 | Pagaila et al. | |
| 8,569,882 B2 | 10/2013 | Ko et al. | |
| 8,581,381 B2 | 11/2013 | Zhao et al. | |
| 8,623,702 B2 | 1/2014 | Pagaila | |
| 8,624,374 B2 | 1/2014 | Ding et al. | |
| 8,674,516 B2 | 3/2014 | Han et al. | |
| 8,790,962 B2 | 7/2014 | Pagaila et al. | |
| 8,847,369 B2 | 9/2014 | Yew et al. | |
| 8,853,819 B2 | 10/2014 | Chen et al. | |
| 8,877,567 B2 | 11/2014 | Lee et al. | |
| 8,932,908 B2 | 1/2015 | Lee et al. | |
| 8,941,222 B2 | 1/2015 | Hunt | |
| 8,987,734 B2 | 3/2015 | Wang | |
| 9,006,099 B2 | 4/2015 | Anderson et al. | |
| 9,029,193 B2 | 5/2015 | Marimuthu et al. | |
| 9,054,083 B2 | 6/2015 | Suthiwongsunthorn et al. | |
| 9,059,186 B2 | 6/2015 | Shim et al. | |
| 9,082,780 B2 | 7/2015 | Lin et al. | |
| 9,105,532 B2 | 8/2015 | Choi et al. | |
| 9,117,812 B2 | 8/2015 | Lee et al. | |
| 9,129,980 B2 | 9/2015 | Khan et al. | |
| 9,142,515 B2 | 9/2015 | Pagaila et al. | |
| 9,171,792 B2 | 10/2015 | Sun et al. | |
| 9,177,832 B2 | 11/2015 | Camacho | |
| 9,236,332 B2 | 1/2016 | Pagaila et al. | |
| 9,236,352 B2 | 1/2016 | Pagaila et al. | |
| 9,240,331 B2 | 1/2016 | Kim et al. | |
| 9,245,834 B2 | 1/2016 | Hsieh | |
| 9,257,356 B2 | 2/2016 | Huang et al. | |
| 9,257,411 B2 | 2/2016 | Pagaila et al. | |
| 9,269,595 B2 | 2/2016 | Chi et al. | |
| 9,275,877 B2 | 3/2016 | Lin et al. | |
| 9,281,228 B2 | 3/2016 | Choi et al. | |
| 9,299,650 B1 | 3/2016 | Chi et al. | |
| 9,324,659 B2 | 4/2016 | Cho et al. | |
| 9,331,002 B2 | 5/2016 | Pagaila et al. | |
| 9,337,116 B2 | 5/2016 | Pagaila et al. | |
| 9,343,387 B2 | 5/2016 | Hsu et al. | |
| 9,373,578 B2 | 6/2016 | Choi et al. | |
| 9,378,983 B2 | 6/2016 | Choi et al. | |
| 9,379,064 B2 | 6/2016 | Oh et al. | |
| 9,390,945 B2 | 7/2016 | Lee et al. | |
| 9,391,046 B2 | 7/2016 | Park et al. | |
| 9,397,074 B1 | 7/2016 | Lee et al. | |
| 9,401,347 B2 | 7/2016 | Lee et al. | |
| 9,406,552 B2 | 8/2016 | Chen et al. | |
| 9,406,579 B2 | 8/2016 | Choi et al. | |
| 9,406,636 B2 | 8/2016 | Zhao et al. | |
| 9,406,658 B2 | 8/2016 | Lee et al. | |
| 9,478,486 B2 | 10/2016 | Kim et al. | |
| 9,484,259 B2 | 11/2016 | Lin et al. | |
| 9,502,335 B2 | 11/2016 | Lai et al. | |
| 9,508,626 B2 | 11/2016 | Pagaila et al. | |
| 9,559,043 B2 | 1/2017 | Ye | |
| 9,570,381 B2 | 2/2017 | Lu et al. | |
| 9,589,910 B2 | 3/2017 | Pagaila et al. | |
| 9,601,369 B2 | 3/2017 | Do et al. | |
| 9,613,912 B2 | 4/2017 | Scanlan | |
| 9,653,407 B2 | 5/2017 | Chen et al. | |
| 9,679,881 B2 | 6/2017 | Pagaila et al. | |
| 9,729,059 B1 | 8/2017 | Parto | |
| 9,754,868 B2 | 9/2017 | Chiang et al. | |
| 9,768,144 B2 | 9/2017 | Wu et al. | |
| 9,799,621 B2 | 10/2017 | Lee et al. | |
| 9,824,923 B2 | 11/2017 | Shariff et al. | |
| 9,824,976 B1 | 11/2017 | Cho | |
| 9,842,808 B2 | 12/2017 | Shin et al. | |
| 9,847,324 B2 | 12/2017 | Lin et al. | |
| 9,922,917 B2 | 3/2018 | Yu et al. | |
| 9,922,955 B2 | 3/2018 | Camacho et al. | |
| 9,966,335 B2 | 5/2018 | Cho et al. | |
| 9,984,993 B2 | 5/2018 | Shu et al. | |
| 9,991,193 B2 | 6/2018 | Essig et al. | |
| 9,997,447 B1 | 6/2018 | Chen et al. | |
| 10,032,652 B2 | 7/2018 | Hsu et al. | |
| 10,096,578 B1 | 10/2018 | Yeh et al. | |
| 10,111,333 B2 | 10/2018 | Yin et al. | |
| 10,115,661 B2 | 10/2018 | Doyle et al. | |
| 10,115,701 B2 | 10/2018 | Zhao et al. | |
| 10,157,821 B1 | 12/2018 | Liu | |
| 10,157,887 B2 | 12/2018 | Chen et al. | |
| 10,157,890 B2 | 12/2018 | Yu et al. | |
| 10,163,867 B2 | 12/2018 | Kim et al. | |
| 10,163,876 B2 | 12/2018 | Jeng et al. | |
| 10,177,099 B2 | 1/2019 | Gerber et al. | |
| 10,186,467 B2 | 1/2019 | Appelt et al. | |
| 10,193,442 B2 | 1/2019 | Parto | |
| 10,199,320 B2 | 2/2019 | Chiang et al. | |
| 10,211,182 B2 | 2/2019 | Meyer et al. | |

(56) References Cited

U.S. PATENT DOCUMENTS

| | | |
|---|---|---|
| 10,224,301 B2 | 3/2019 | Fang et al. |
| 10,229,859 B2 | 3/2019 | Wang |
| 10,229,892 B2 | 3/2019 | Appelt |
| 10,256,173 B2 | 4/2019 | Wu et al. |
| 10,269,771 B2 | 4/2019 | Lyu et al. |
| 10,276,382 B2 | 4/2019 | Hunt et al. |
| 10,297,518 B2 | 5/2019 | Lin et al. |
| 10,297,519 B2 | 5/2019 | Lin |
| 10,319,507 B2 | 6/2019 | Klesyk et al. |
| 10,325,868 B2 | 6/2019 | Tsai |
| 10,332,862 B2 | 6/2019 | Chen et al. |
| 10,361,150 B2 | 7/2019 | Chung et al. |
| 10,381,300 B2 | 8/2019 | Kao et al. |
| 10,388,598 B2 | 8/2019 | Lu et al. |
| 10,403,609 B2 | 9/2019 | Geissler et al. |
| 10,410,970 B1 | 9/2019 | Chiu et al. |
| 10,418,314 B2 | 9/2019 | Lu |
| 10,446,411 B2 | 10/2019 | Chen et al. |
| 10,453,785 B2 | 10/2019 | Shim et al. |
| 10,453,802 B2 | 10/2019 | Hu |
| 10,497,635 B2 | 12/2019 | Brazzle et al. |
| 10,510,703 B2 | 12/2019 | Chi et al. |
| 10,510,720 B2 | 12/2019 | Lin et al. |
| 10,515,806 B2 | 12/2019 | Hunt et al. |
| 10,515,889 B2 | 12/2019 | Lu |
| 10,522,476 B2 | 12/2019 | Cheng et al. |
| 10,535,521 B2 | 1/2020 | Hunt et al. |
| 10,535,597 B2 | 1/2020 | Chen et al. |
| 10,548,249 B2 | 1/2020 | Mokler et al. |
| 10,553,487 B2 | 2/2020 | Zhao et al. |
| 10,573,624 B2 | 2/2020 | Chen et al. |
| 10,586,751 B2 | 3/2020 | Huang |
| 10,602,612 B1 | 3/2020 | Hoang et al. |
| 10,607,955 B2 | 3/2020 | Chiu et al. |
| 10,629,454 B2 | 4/2020 | Yeh |
| 10,629,531 B2 | 4/2020 | Lin |
| 10,636,756 B2 | 4/2020 | Yang et al. |
| 11,134,570 B2 | 9/2021 | Lu et al. |
| 11,272,618 B2 | 3/2022 | Brazzle et al. |
| 11,410,977 B2 | 8/2022 | Brazzle et al. |
| 2002/0089069 A1 | 7/2002 | Lamson et al. |
| 2003/0053286 A1 | 3/2003 | Masuda et al. |
| 2004/0124505 A1 | 7/2004 | Mahle et al. |
| 2004/0201081 A1 | 10/2004 | Joshi et al. |
| 2004/0222514 A1* | 11/2004 | Crane, Jr. ............ H05K 7/1076 257/697 |
| 2004/0262774 A1 | 12/2004 | Kang et al. |
| 2005/0095835 A1 | 5/2005 | Humpston et al. |
| 2007/0114352 A1 | 5/2007 | Victor R. Cruz et al. |
| 2007/0222044 A1 | 9/2007 | Otremba |
| 2007/0246806 A1 | 10/2007 | Ong et al. |
| 2007/0262346 A1 | 11/2007 | Otremba et al. |
| 2007/0273049 A1 | 11/2007 | Khan et al. |
| 2008/0122049 A1 | 5/2008 | Zhao et al. |
| 2008/0128890 A1 | 6/2008 | Choi et al. |
| 2010/0013064 A1 | 1/2010 | Hsu |
| 2010/0133674 A1 | 6/2010 | Hebert et al. |
| 2011/0013349 A1 | 1/2011 | Morikita et al. |
| 2011/0115060 A1 | 5/2011 | Chiu et al. |
| 2011/0177654 A1 | 7/2011 | Lee et al. |
| 2011/0228507 A1 | 9/2011 | Yin et al. |
| 2011/0241194 A1 | 10/2011 | Chen et al. |
| 2011/0266699 A1 | 11/2011 | Hilt et al. |
| 2011/0292632 A1 | 12/2011 | Wen et al. |
| 2012/0025227 A1 | 2/2012 | Chan et al. |
| 2012/0074532 A1 | 3/2012 | Shih et al. |
| 2012/0139122 A1 | 6/2012 | Honjo |
| 2012/0181689 A1 | 7/2012 | Do et al. |
| 2012/0223428 A1 | 9/2012 | Pendse |
| 2012/0273960 A1 | 11/2012 | Park et al. |
| 2013/0015569 A1 | 1/2013 | Anderson et al. |
| 2013/0127029 A1 | 5/2013 | Lee et al. |
| 2013/0200527 A1 | 8/2013 | Yang et al. |
| 2013/0214399 A1 | 8/2013 | Joshi et al. |
| 2013/0234324 A1 | 9/2013 | Cho et al. |
| 2013/0249051 A1 | 9/2013 | Saye |
| 2013/0299971 A1 | 11/2013 | Do et al. |
| 2013/0341786 A1 | 12/2013 | Hsu et al. |
| 2014/0110860 A1 | 4/2014 | Choi et al. |
| 2014/0124919 A1 | 5/2014 | Huang et al. |
| 2014/0138807 A1 | 5/2014 | Gowda et al. |
| 2014/0145319 A1 | 5/2014 | Meinhold et al. |
| 2014/0151880 A1 | 6/2014 | Kao et al. |
| 2014/0154843 A1 | 6/2014 | Liu et al. |
| 2014/0159251 A1 | 6/2014 | Marimuthu et al. |
| 2014/0251670 A1 | 9/2014 | Sakai et al. |
| 2014/0264914 A1* | 9/2014 | Meyer ............ H01L 23/3107 257/774 |
| 2014/0312503 A1 | 10/2014 | Seo |
| 2014/0361423 A1 | 12/2014 | Chi et al. |
| 2015/0061095 A1 | 3/2015 | Choi et al. |
| 2015/0084206 A1 | 3/2015 | Lin |
| 2015/0179570 A1 | 6/2015 | Marimuthu et al. |
| 2015/0179626 A1 | 6/2015 | Zhang et al. |
| 2015/0187710 A1 | 7/2015 | Scanlan et al. |
| 2015/0255360 A1 | 9/2015 | Hsu et al. |
| 2015/0279778 A1 | 10/2015 | Camacho et al. |
| 2015/0279815 A1 | 10/2015 | Do et al. |
| 2015/0325509 A1 | 11/2015 | We et al. |
| 2015/0325516 A1 | 11/2015 | Lin et al. |
| 2016/0035656 A1 | 2/2016 | Haba et al. |
| 2016/0066406 A1 | 3/2016 | Chen et al. |
| 2016/0071831 A1 | 3/2016 | Lee et al. |
| 2016/0088754 A1 | 3/2016 | Francis |
| 2016/0126176 A1 | 5/2016 | Chang et al. |
| 2016/0150632 A1 | 5/2016 | Viswanathan et al. |
| 2016/0276256 A1 | 9/2016 | Chiang et al. |
| 2016/0284642 A1 | 9/2016 | Ganesan et al. |
| 2016/0307799 A1 | 10/2016 | Ho et al. |
| 2016/0322343 A1 | 11/2016 | Scanlan |
| 2016/0329272 A1 | 11/2016 | Geissler et al. |
| 2016/0343651 A1 | 11/2016 | Rae et al. |
| 2017/0011936 A1 | 1/2017 | Lin et al. |
| 2017/0062120 A1 | 3/2017 | Yun et al. |
| 2017/0077039 A1 | 3/2017 | Liao et al. |
| 2017/0077364 A1 | 3/2017 | Renn et al. |
| 2017/0098610 A1 | 4/2017 | Shim et al. |
| 2017/0110392 A1 | 4/2017 | Lin et al. |
| 2017/0148746 A1 | 5/2017 | Chiu et al. |
| 2017/0162476 A1 | 6/2017 | Meyer et al. |
| 2017/0179041 A1 | 6/2017 | Dias et al. |
| 2017/0179048 A1* | 6/2017 | Moussaoui ............ H01L 23/645 |
| 2017/0186702 A1 | 6/2017 | Liang et al. |
| 2017/0221858 A1 | 8/2017 | Yu et al. |
| 2017/0250172 A1 | 8/2017 | Huang et al. |
| 2017/0256481 A1 | 9/2017 | Chen et al. |
| 2017/0278807 A1 | 9/2017 | Chiu et al. |
| 2017/0311447 A1 | 10/2017 | Brazzle et al. |
| 2018/0052281 A1 | 2/2018 | Kuo et al. |
| 2018/0061815 A1 | 3/2018 | Fang et al. |
| 2018/0068970 A1 | 3/2018 | Tanida et al. |
| 2018/0068983 A1 | 3/2018 | Chang et al. |
| 2018/0076165 A1 | 3/2018 | Aoki et al. |
| 2018/0090466 A1 | 3/2018 | Hung |
| 2018/0102325 A1 | 4/2018 | Yu et al. |
| 2018/0130774 A1 | 5/2018 | Lin et al. |
| 2018/0138113 A1 | 5/2018 | Chen et al. |
| 2018/0138131 A1 | 5/2018 | Kawabata |
| 2018/0151485 A1 | 5/2018 | Kao et al. |
| 2018/0158779 A1 | 6/2018 | Yang et al. |
| 2018/0182704 A1 | 6/2018 | Yeh |
| 2018/0261551 A1 | 9/2018 | Lee et al. |
| 2018/0269708 A1 | 9/2018 | Yeh |
| 2018/0297834 A1 | 10/2018 | Renaud-Bezot et al. |
| 2018/0331018 A1 | 11/2018 | Shim et al. |
| 2018/0331050 A1 | 11/2018 | Chung et al. |
| 2018/0337130 A1 | 11/2018 | Chang Chien et al. |
| 2018/0342484 A1 | 11/2018 | Chiu et al. |
| 2018/0350766 A1 | 12/2018 | Sato et al. |
| 2018/0374798 A1 | 12/2018 | Lee et al. |
| 2018/0374833 A1 | 12/2018 | Wong et al. |
| 2019/0013301 A1 | 1/2019 | Cheah et al. |
| 2019/0019763 A1 | 1/2019 | Chang et al. |
| 2019/0043819 A1 | 2/2019 | Ho et al. |

(56) References Cited

U.S. PATENT DOCUMENTS

| | | |
|---|---|---|
| 2019/0051590 A1 | 2/2019 | Fang et al. |
| 2019/0057940 A1 | 2/2019 | Cheah et al. |
| 2019/0115319 A1 | 4/2019 | Hiner et al. |
| 2019/0132983 A1 | 5/2019 | Weis et al. |
| 2019/0139846 A1 | 5/2019 | Lu |
| 2019/0139946 A1 | 5/2019 | Kim et al. |
| 2019/0141834 A1 | 5/2019 | Brazzle et al. |
| 2019/0148304 A1 | 5/2019 | Gavagnin et al. |
| 2019/0206799 A1 | 7/2019 | Keser et al. |
| 2019/0237374 A1 | 8/2019 | Huang et al. |
| 2019/0252305 A1 | 8/2019 | Peng et al. |
| 2019/0273044 A1 | 9/2019 | Fu et al. |
| 2019/0304807 A1 | 10/2019 | Baloglu et al. |
| 2019/0304865 A1 | 10/2019 | Brazzle et al. |
| 2019/0304936 A1 | 10/2019 | Shaul et al. |
| 2019/0319337 A1 | 10/2019 | Yen |
| 2019/0355654 A1 | 11/2019 | Xu et al. |
| 2019/0363423 A1 | 11/2019 | Lu et al. |
| 2019/0371621 A1 | 12/2019 | Darmawikarta et al. |
| 2019/0393140 A1 | 12/2019 | Yeh et al. |
| 2020/0006089 A1 | 1/2020 | Yu et al. |
| 2020/0006253 A1 | 1/2020 | Cheah et al. |
| 2020/0006295 A1 | 1/2020 | Yang et al. |
| 2020/0051927 A1 | 2/2020 | Lin et al. |
| 2020/0075490 A1 | 3/2020 | Sung et al. |
| 2020/0075562 A1 | 3/2020 | Yu et al. |
| 2020/0083591 A1 | 3/2020 | Hsieh et al. |
| 2020/0091059 A1 | 3/2020 | Lin et al. |
| 2020/0105653 A1 | 4/2020 | Elsherbini et al. |
| 2020/0111717 A1 | 4/2020 | Gmunder et al. |
| 2020/0111748 A1 | 4/2020 | Leitgeb |
| 2020/0120794 A1 | 4/2020 | Somada et al. |
| 2020/0126921 A1 | 4/2020 | Nair et al. |
| 2020/0144198 A1 | 5/2020 | Lee et al. |
| 2020/0152372 A1 | 5/2020 | Wei et al. |
| 2020/0152614 A1 | 5/2020 | Brazzle et al. |
| 2020/0185293 A1 | 6/2020 | Schmalzl et al. |
| 2020/0185330 A1 | 6/2020 | Yu et al. |
| 2020/0205279 A1 | 6/2020 | Ecton et al. |
| 2020/0211927 A1 | 7/2020 | Wan et al. |
| 2021/0082790 A1 | 3/2021 | Zhang et al. |
| 2021/0378098 A1 | 12/2021 | Brazzle et al. |
| 2022/0255249 A1 | 8/2022 | Kikuta |

FOREIGN PATENT DOCUMENTS

| | | |
|---|---|---|
| CN | 201893335 U | 7/2011 |
| CN | 203839367 U | 9/2014 |
| CN | 104221145 | 12/2014 |
| CN | 104934391 | 9/2015 |
| CN | 107170718 | 9/2017 |
| CN | 109075151 | 12/2018 |
| CN | 110299329 | 10/2019 |
| CN | 110364491 | 10/2019 |
| CN | 111108598 | 5/2020 |
| CN | 111149201 | 5/2020 |
| EP | 0384927 | 9/1990 |
| EP | 2381472 | 10/2011 |
| EP | 3217774 | 9/2017 |
| JP | S59-155154 | 9/1984 |
| KR | 20200010521 | 1/2020 |
| WO | WO 2010/067508 | 6/2010 |
| WO | WO 2017/189224 | 11/2017 |
| WO | WO 2019/066986 | 4/2019 |
| WO | WO 2019/066987 | 4/2019 |
| WO | WO 2019/132963 | 7/2019 |
| WO | WO 2019/132965 | 7/2019 |
| WO | WO 2021/124691 | 6/2021 |

OTHER PUBLICATIONS

International Search Report and Written Opinion for International Application No. PCT/US2019/021908, dated Aug. 27, 2019, in 16 pages.
International Search Report and Written Opinion for application No. PCT/US2017/027047, dated Jun. 29, 2017, in 10 pages.
International Preliminary Report on Patentability for application No. PCT/US2017/027047, dated Oct. 30, 2018, in 7 pages.
International Preliminary Report on Patentability for application No. PCT/US2019/021908, dated Sep. 29, 2020, in 9 pages.
Final Office Action in U.S. Appl. No. 15/495,405, dated Oct. 18, 2018, in 17 pages.
Non-Final Office Action in U.S. Appl. No. 15/495,405, dated Apr. 5, 2018, in 12 pages.
Response in U.S. Appl. No. 15/495,405, filed Jun. 12, 2018, in 8 pages.
Office Action in Taiwan Application No. 106113400, dated Jul. 4, 2018, with concise statement of relevance, in 5 pages.
Response in Taiwan Application No. 106113400, filed Jan. 9, 2019, with English claims, in 4 pages.
Office Action in Taiwan Application No. 106113400, dated Jan. 16, 2019, in 10 pages.
Response in Taiwan Application No. 106113400, filed Apr. 3, 2019, with English claims, in 16 pages.
Office Action in Taiwan Application No. 106113400, dated Apr. 29, 2019, with English translation, in 4 pages.
Response to Communication Pursuant to Rules 161(1) and 162 EPC, with English Claims, in European Application No. 17719130.1, filed Jun. 3, 2019, in 24 pages.
Partial Search Report in European Application No. 21175552.5, dated Oct. 29, 2021, in 11 pages.
Office Action in Chinese Application No. 201780025431.5, dated Nov. 30, 2021.
"DW3316 Coupled Inductors for xDSL", Document 232, revised Nov. 9, 2020, www.coilcraft.com, 1 page.
Office Action with English translation in Chinese Application No. 201780025431.5, dated Jul. 18, 2022.
Office Action in Chinese Application No. 201980000486.X, dated Sep. 20, 2022.

* cited by examiner

STACKED CIRCUIT PACKAGE WITH MOLDED BASE HAVING LASER DRILLED OPENINGS FOR UPPER PACKAGE

CROSS-REFERENCE TO RELATED APPLICATIONS

This application is a continuation of International Application No. PCT/US2019/021908 (now International Publication No. WO2019/190741), filed Mar. 12, 2019, which is a continuation of and claims priority to U.S. patent application Ser. No. 16/152,182 (now U.S. Pat. No. 10,497,635), filed Oct. 4, 2018, which claims priority of U.S. Provisional Patent Application Ser. No. 62/648,835, filed Mar. 27, 2018, by John D. Brazzle et al., the entire contents of which are incorporated herein by reference for all purposes. International Application No. PCT/US2019/021908 (now International Publication No. WO2019/190741), filed Mar. 12, 2019, also claims priority to U.S. Provisional Patent Application Ser. No. 62/648,835, filed Mar. 27, 2018. Further, any and all applications for which a foreign or domestic priority claim is identified in the Application Data Sheet as filed with the present application are hereby incorporated by reference under 37 CFR 1.57.

FIELD OF THE INVENTION

This invention relates to the packaging of electronic components and, in particular, to a stacked package structure having a base package and an interconnected upper package.

BACKGROUND

It is common to provide an integrated circuit, or a circuit formed of discrete components, in a single sealed package having a standardized terminal configuration (e.g., ball grid array, in-line pins, surface mount leads, etc.). The terminals of the package are typically then soldered to a printed circuit board along with other packages and components.

Relevant factors in a package design include size, terminal count, heat dissipation, current/voltage requirements, and electrical/magnetic interference issues.

To reduce the size of an electrical system, it is known to stack packages on top of each other, where the bottom package includes bottom terminals, for being soldered to a printed circuit board, and top terminals for being soldered to the terminals of the upper package. The bottom package has vias leading from its top terminals to internal circuitry or to the bottom terminals on the bottom package. This is also referred to as a 3-dimensional package.

For certain applications, such as high power applications, a more robust structure is needed for stacked packages. For such high power applications, such as a 20 A-100 A switching voltage regulator, it is desirable to provide very low impedance current paths to minimize heat and voltage drop, as well as provide good thermal paths to air and to a metal core printed circuit board. Also, certain components, such as inductors and transformers, should be separated from other circuits for minimizing magnetic coupling and noise.

Therefore, what is needed is a more robust package that solves some of the existing problems with conventional stacked packing technology.

SUMMARY

In one embodiment of the invention, a circuit is formed of components included in both a bottom package and an upper package. The bottom package may include a switching transistor and control circuitry for a high power switching voltage regulator. The bottom package includes a substrate having on its top surface circuitry, metal traces for interconnecting the circuitry, and metal pads connected to the circuitry. The metal pads align with leads of an upper package. The bottom surface of the bottom package may include a ball grid array for soldering to a conventional metal core printed circuit board.

The circuitry on the bottom package is then encapsulated with a molded thermal plastic to form a rectangular package with a top planar surface.

A programmed laser is then controlled to drill openings in the molded plastic which extend down to the metal pads on the substrate. The holes are then partially filled with a solder, a solder paste, or other conductive material. The laser not only drills the holes but cleans the metal pads on the substrate.

Next, an upper package, such as containing a relatively large smoothing inductor for the switching regulator, is positioned over the bottom package. The upper package has bottom terminals, such as posts or staple-type leads, that extend through the holes and electrically contact the pads exposed through the holes.

Preferably, there is a small gap between the ends of the leads of the upper package and the rigid metal pads formed on the substrate of the bottom package so the upper package may be tilted, as required, to have a top planar surface that is precisely parallel to the bottom surface of the bottom package irrespective of the non-planarity of the leads of the upper package. This ensures that the top of the upper package will be coplanar with the tops of other upper packages on the printed circuit board, such as for contacting a single heat sink with a flat surface. The gaps are pre-filled with a solder paste, solder, or other suitable conductive material that melts during reflow and allows the top of the upper package to be tilted to be precisely parallel with the bottom of the bottom package.

The stacked structure is then reflowed to melt and cure any solder paste, solder, or other conductive material so that the upper package is electrically, thermally, and mechanically connected to the bottom package. The upper package may also be epoxied to the top of the bottom package, using a thermal epoxy, which cures during the reflow.

Solder balls for a ball grid array may then be formed on the bottom of the bottom package and reflowed. The cured epoxy between the upper package and the bottom package ensures the upper package will not change its position during the ball grid array reflow.

If the upper package is a smoothing inductor for a switching regulator, and the bottom package contains the rest of the switching regulator circuitry, there will be excellent heat transfer between the inductor and the metal core printed circuit board since the leads of the inductor are directly connected to the metal pads on the substrate of the bottom package. Also, the inductor is vertically separated from the remaining circuitry and may be magnetically isolated from the bottom circuitry.

Although a switching regular with an inductor has been used in the example, the technique may be used to form any other circuit. For example, the upper package may include a transformer.

The upper package does not need to be an electrical component. The upper device may be a metal heat sink with robust tabs that extend through holes in the bottom package and thermally contact metal pads on the substrate of the bottom package. The upper device may also provide RF shielding, such as being a grounded plate, or provide any other function.

An array of stacked packages may be formed simultaneously prior to singulation of the packages, such as by sawing.

DETAILED DESCRIPTION

Although the stacked package may be used for any type of circuitry, an example will be provided for a high power switching regulator having a stacked transformer or inductor. The regulator may provide an output current of up to 100 A to a load due to the particular design described.

Figure 1:
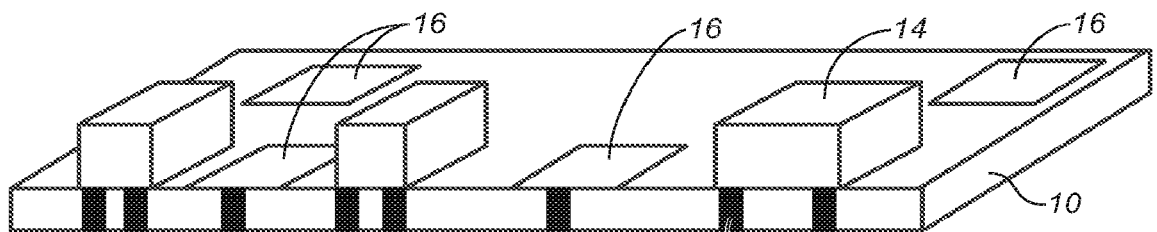
FIG. 1 is a cross-sectional perspective view of a substrate with circuitry mounted on the top of the substrate and conductive through-vias that electrically contact bottom pads of the substrate. Also shown are relatively large metal pads on the top of the substrate that are to be contacted by leads of an upper package.

FIG. 1 is a cross-sectional view of a starting substrate 10 for a bottom package. The substrate 10 may be a conventional printed circuit board material or a molded thermal plastic. In one embodiment, the substrate 10 is about 0.3 mm thick. The substrate 10 has conductive through-vias 12 that may be contacted by metal traces on the top the surface of the substrate 10 that interconnect circuit components 14. The components 14 may include integrated circuits and discrete components. The vias 12 terminate in bottom metal pads, such as for a ball grid array.

Relatively large top pads 16 are also shown, which align with leads of an upper package. Some of the vias 12 may terminate in the top pads 16. The pads 16 may be interconnected to other circuitry on the substrate 10. The vias 12 may be used for conducting heat from the upper package to a metal core printed circuit board. Some vias 12 may be connected together for a parallel conduction path.

In the example, the circuitry forms a switching transistor and control circuitry for a switching voltage regulator.

Figure 2:
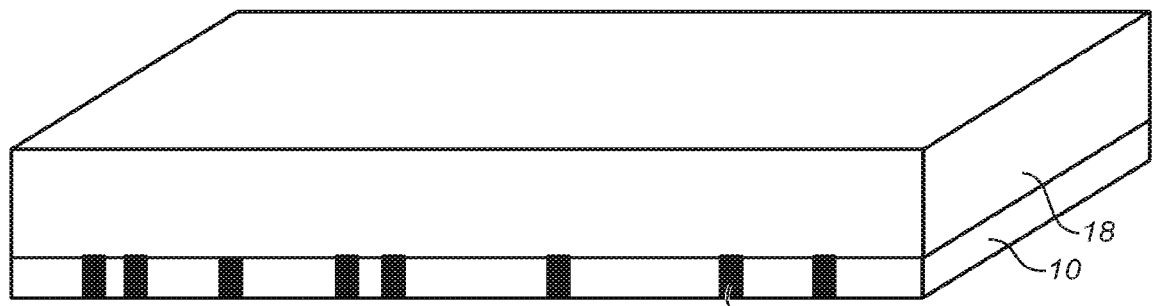
FIG. 2 illustrates the substrate of FIG. 1 after a thermal plastic is molded over the top of the substrate to encapsulate the circuitry and provide a planar top surface.

FIG. 2 illustrates a thermal plastic 18 molded over the substrate 10 to encapsulate the circuitry. The top of the plastic 18 is planar. The plastic 18 is a very good conductor of heat and is a dielectric.

Figure 3:
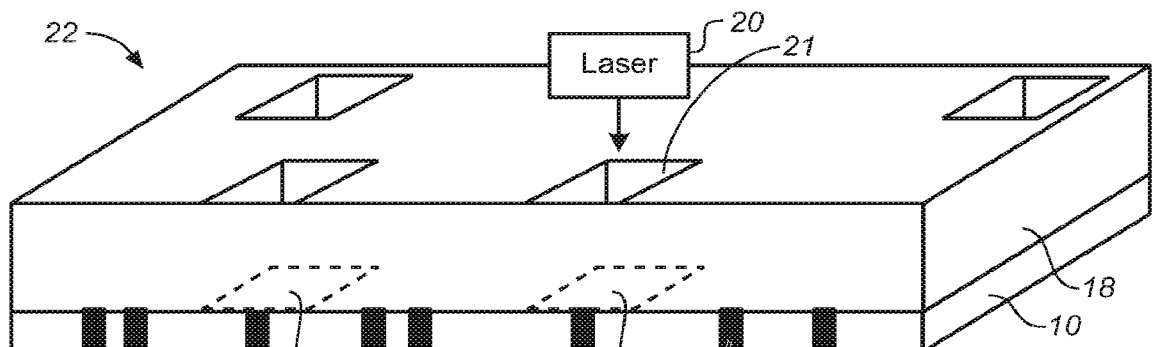
FIG. 3 illustrates a programmed laser drilling holes in the thermal plastic to expose the pads on the substrate.

In FIG. 3, a programmed laser 20 ablates holes 21 (of any shape) in the plastic 18 to expose the pads 16 on the substrate 10. In one embodiment, the pads 16 are formed to have a layer of solder for better wicking to metal leads of an upper package. The laser drilling automatically stops at the solder/pad surface and may clean the surface. The resulting structure is a bottom package 22 for the stacked package structure.

Figure 4:
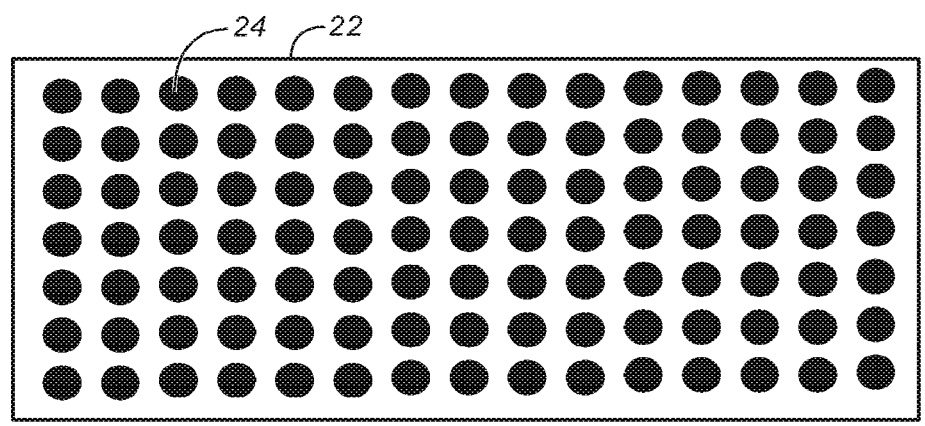
FIG. 4 illustrates the bottom of the package showing a ball grid array configuration for being soldered to a printed circuit board.

FIG. 4 illustrates a possible bottom surface of the bottom package 22 showing small metal pads 24 for a ball grid array.

A conductive material, such as solder, a solder paste, or a conductive epoxy is then dispensed into each of the holes 21 and will be used to electrically connect leads of an upper package to the pads 16 while not requiring the leads to directly abut the pads 16. This conductive material filling the gap between the leads and the pads 16 allows the upper package to be tilted, during a reflow step, to be precisely parallel to the bottom package 22 even if the leads are not planar.

Figure 5:
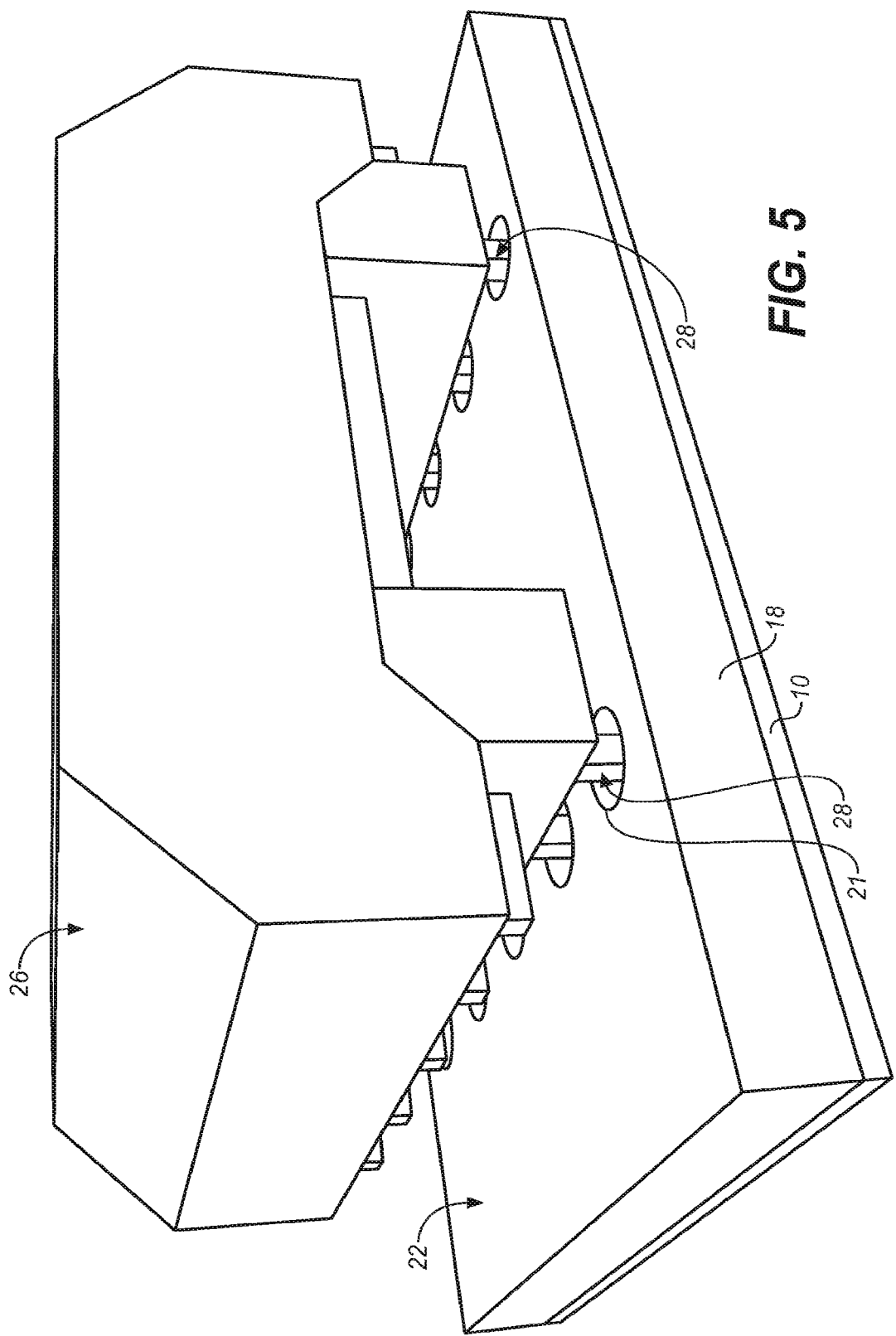
FIG. 5 illustrates one type of upper package whose metal posts are inserted through the holes in the bottom package to electrically contact the pads formed on the substrate.

FIG. 5 illustrates an upper package 26 having leads formed as rectangular posts 28. The holes 21 in the bottom package 22 align with the pattern of the posts 28. The bottom surface of the upper package 26 does not need to contact the top surface of the bottom package 22, and the angle of the upper package 26 may be adjusted during reflow to achieve a precise alignment of the upper package 26 with the bottom package 22. In one embodiment, the upper package 26 contains a transformer.

Figure 6:
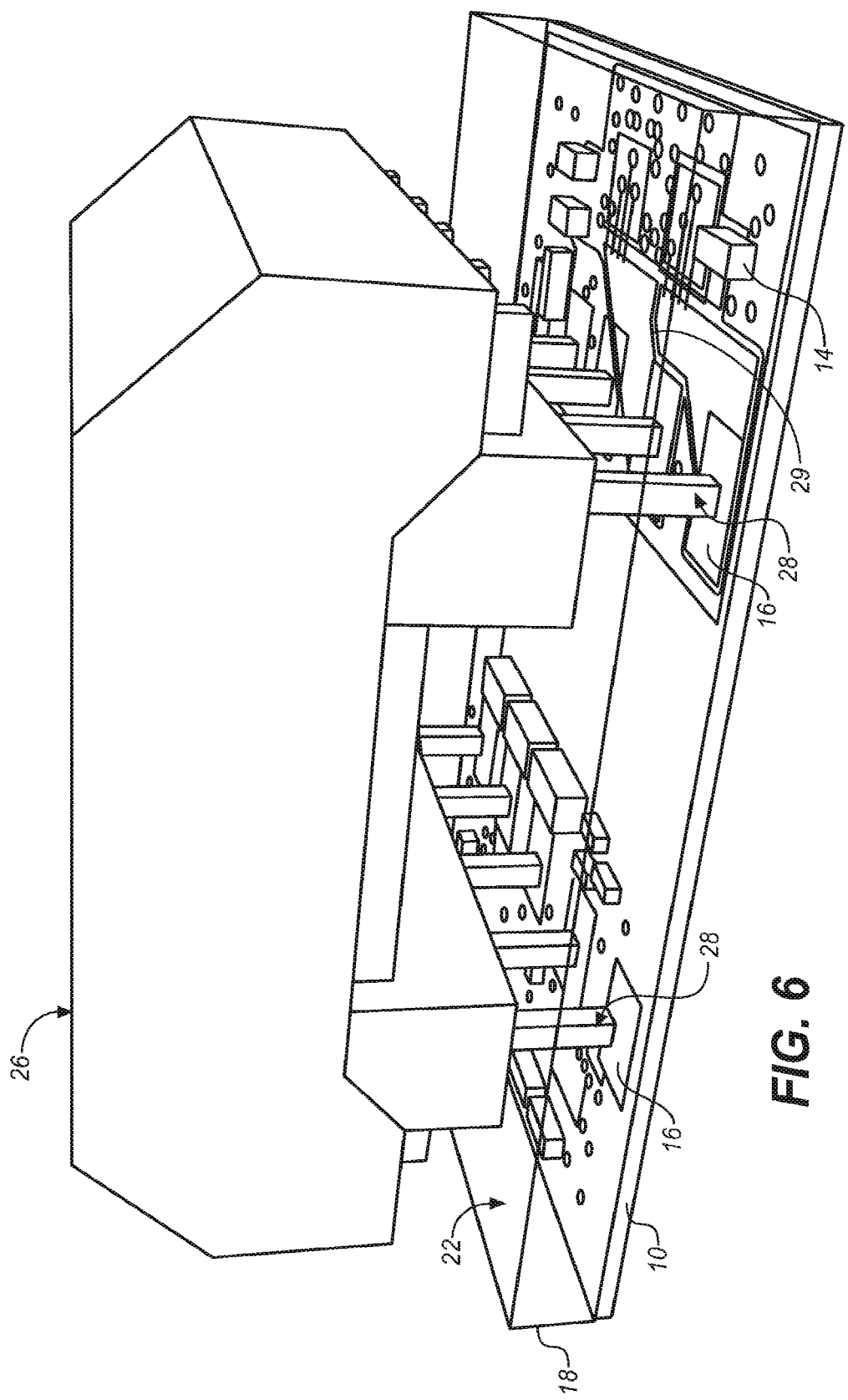
FIG. 6 illustrates the upper package of FIG. 5 as well as a transparent bottom package.

FIG. 6 illustrates the structure of FIG. 5 but where the bottom package 22 is transparent. The ends of the posts 28 will not all abut the pads 16 on the substrate 10 if either the posts 28 or the pads 16 are not coplanar.

Figure 7:
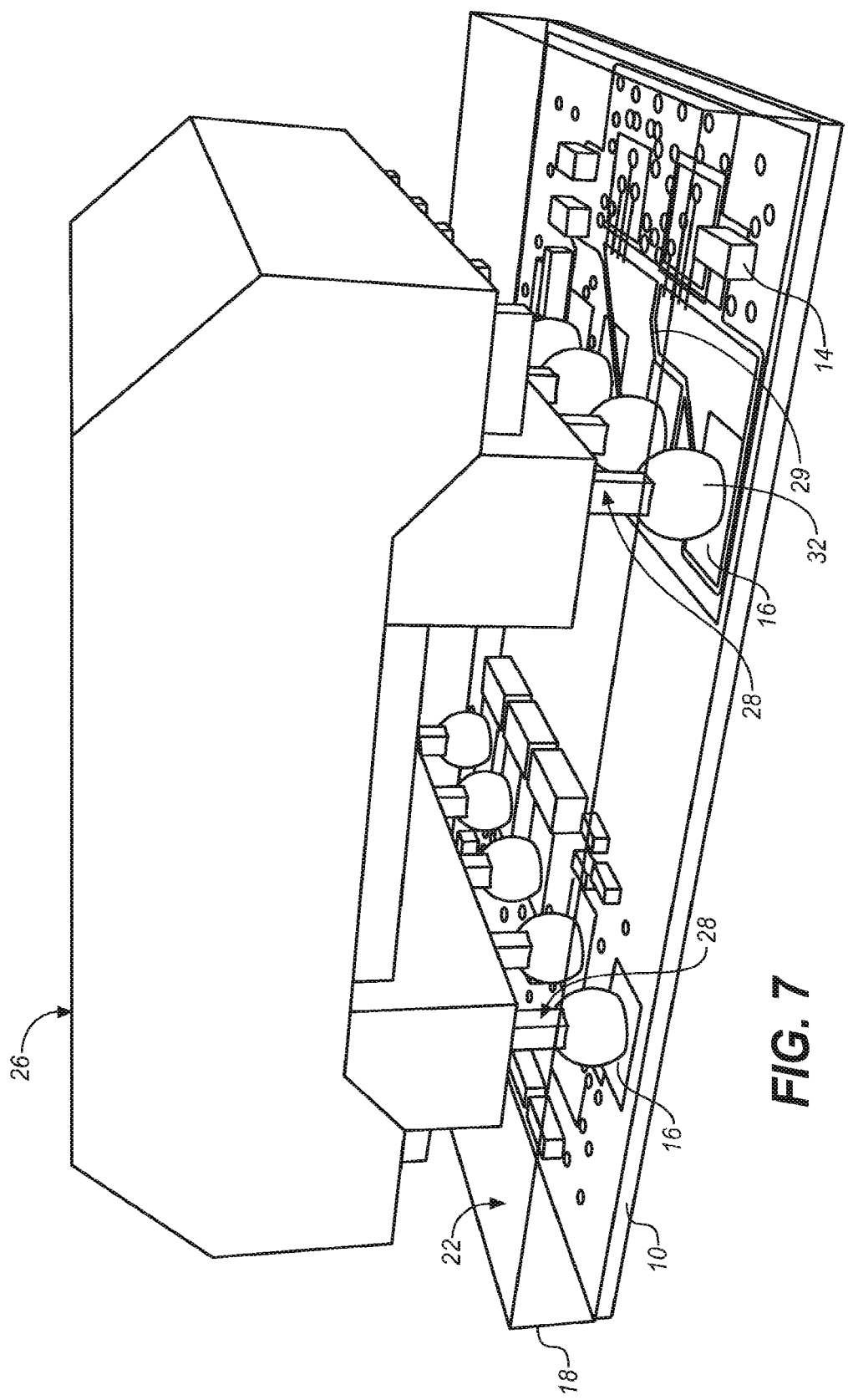
FIG. 7 illustrates an alternative to FIG. 6 where excess solder, or other conductive material, is deposited in the holes and wick up the posts when melted for a robust electrical connection.

As shown in FIG. 7, to account for this lack of coplanarity, the holes in the bottom package 22 are partially filled with a conductive material 32, such as solder, a solder paste, or other conductive material, prior to inserting the posts 28 into the holes 21, that allows the upper package 26 to be positioned precisely parallel with the bottom package 22. The conductive material 32 may be dispensed with a needle or squeegeed into the holes 21. Thus, it is desirable to form the holes 21 significantly wider than the posts 28 so the conductive material 32 is not pushed out by the posts 28.

The bottom surface of the upper package 26 may optionally be affixed to the top of the bottom package 22 using a thermal epoxy to firmly set the position of the upper package 26 on the bottom package 22 after a reflow step. During reflow, the conductive material 32 will melt and wick to the posts 28 and pads 16 for a good electrical, thermal, and mechanical connection, while the upper package 26 is being precisely aligned with the bottom package 22 using an alignment tool. During the reflow, the heat also cures the thermal epoxy.

Conductive traces 29 on the substrate 10 are shown interconnecting circuit components 14 and the pads 16.

After the upper package 26 posts 28 are soldered to the pads 16, the structure may be turned over and solder balls placed on the bottom pads 24 (FIG. 4) of the bottom package 22 to form a ball grid array. A reflow step melts the solder over the pads 24. Such a reflow step does not affect the position of the upper package 26 if the upper package 26 is epoxied to the bottom package 22.

Figure 8:
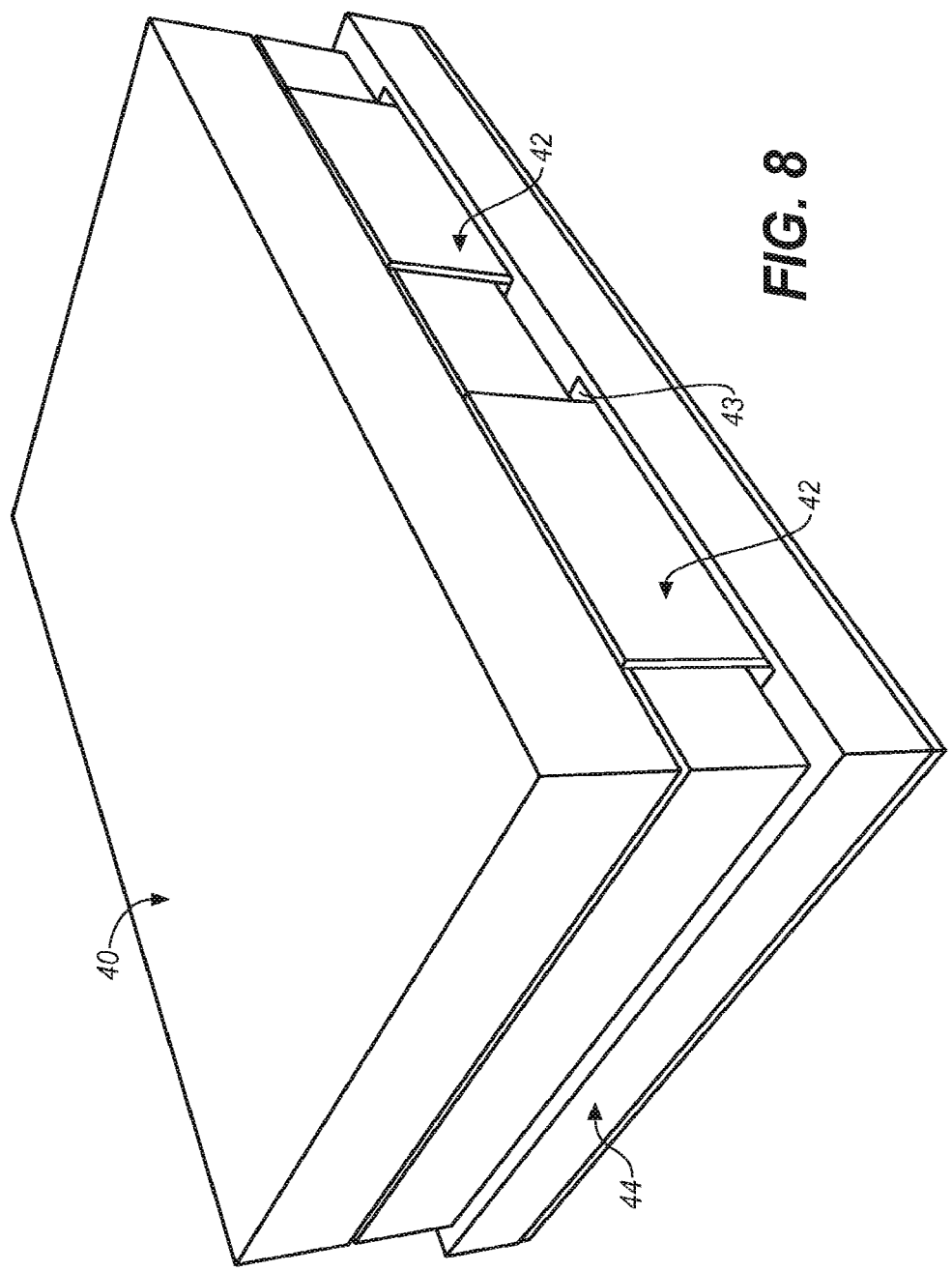
FIG. 8 illustrates a completed stacked package where the upper package uses staple-type leads around the perimeter of the upper package, and where the staple-type leads are inserted into laser drilled slots in the bottom package and electrically contact metal pads on the substrate in the bottom package.
Figure 9:
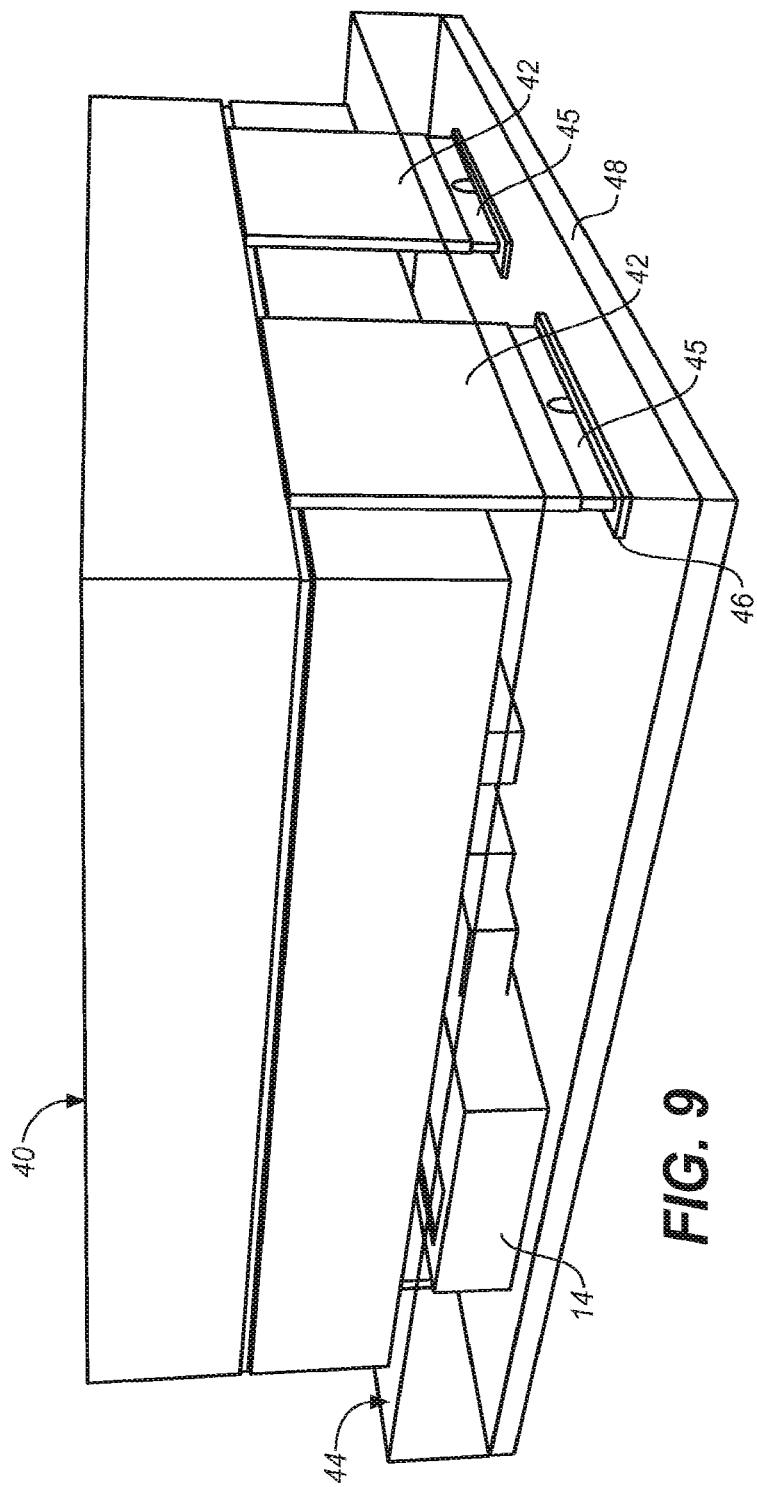
FIG. 9 illustrates the stacked package of FIG. 8 with a transparent bottom package.
Figure 10:
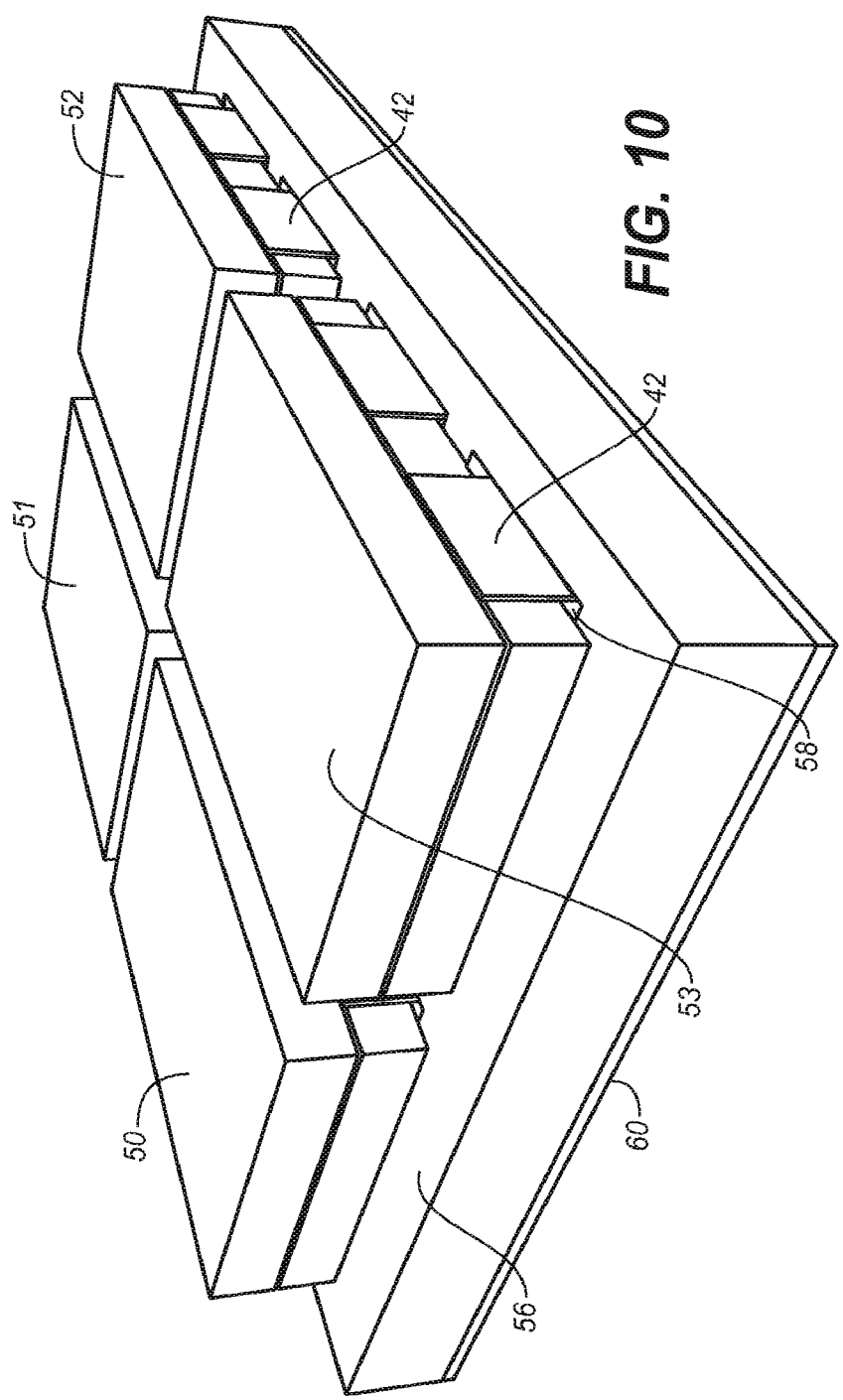
FIG. 10 illustrates multiple upper packages mounted over a single bottom package, where the tops of all the upper packages are co-planar.

FIGS. 8-10 illustrate a different type of lead for the upper package 40 known as a staple lead 42. A staple lead is a thin and wide lead that is a good conductor of high currents and heat. It is particularly desirable when the upper package 40 is a high power inductor for a switching regulator. In one embodiment, the inductor is encased in a ferrite material which is highly thermally conductive.

The bottom package 44 may be identical to the bottom package of FIG. 3, except for the location and shape of the pads and the laser drilled holes 43.

FIG. 9 shows the bottom package 44 as transparent and illustrates how the staple leads 42 extend through the laser drilled holes 43 (FIG. 8) in the bottom package 44 and may or may not abut the metal pads 46 formed on the substrate 48 of the bottom package 44. As previously described, after the holes 43 are formed, they are partially filled with a conductive material 45 that reflows and wicks to the pads 46 and the staple leads 42 for a good electrical, thermal, and mechanical connection.

The bottom of the upper package 40 may be epoxied to the top of the bottom package 44, using a thermal epoxy, to manipulate its alignment during the reflow step. The epoxy cures during the reflow step.

FIG. 10 illustrates how multiple upper packages 50-53 may be mounted over a single bottom package 56. The upper packages 50-53 each have four staple leads 42 that are inserted into laser drilled holes 58 in the bottom package 56 and electrically contact pads formed on the substrate 60. The bottom surface may be a ball grid array. Any other type of terminal configuration may be used.

Importantly, the ability to align each upper package 50-53 with respect to the bottom package 56 and with each other during the reflow step enables the top surfaces of all the upper packages 50-53 to be precisely coplanar. Therefore, a single heat sink with a flat surface may be positioned over the upper packages 50-53 and contact all the top surfaces equally.

Figure 11:
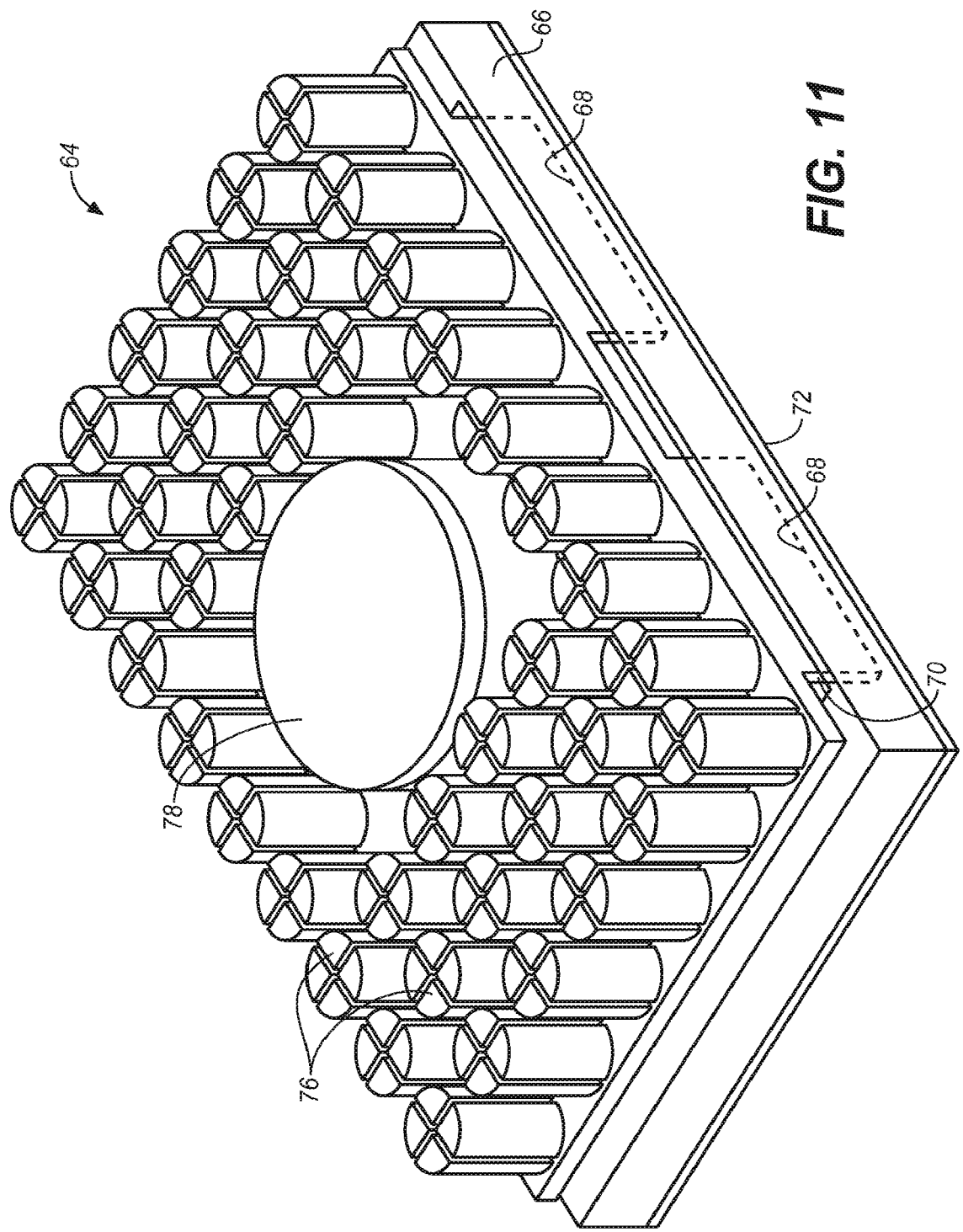
FIG. 11 illustrates a metal heat sink having tabs inserted through holes in the bottom package that are thermally connected to metal pads on the substrate of the bottom package.

FIG. 11 illustrates a heat sink 64 mounted over a bottom package 66. The heat sink 64 may be formed of copper or other thermally conductive material. The heat sink 64 has robust tabs 68 that extend into holes 70 (slots) laser drilled into the molded plastic of the bottom package 66. There may be distributed tabs 68 along the bottom of the heat sink 64, or the tabs 68 may just be along two or more sides of the heat sink 64.

The substrate 72 of the bottom package 66 has robust metal pads, similar to the pads 46 shown in FIG. 9, that are thermally coupled to the tabs 68. In one embodiment, prior to the heat sink 64 being mounted, a solder paste, a conductive epoxy, sinterable material, or some other thermally conductive material partially fills the holes 70, and the heat sink tabs 68 are inserted into the holes 70. The thermally conductive material fills any gap between the tabs 68 and the pads. Upon reflow, the thermally conductive material flows and then hardens, resulting in a good thermal and mechanical attachment of the heat sink 64 to the bottom package 66. The bottom surface of the heat sink 64 may be thermally epoxied to the top surface of the bottom package 66 for additional thermal contact. The heat sink 64 may be precisely aligned with the bottom package 66 during the reflow step, even if the tabs 68 are not coplanar, since the tabs 68 do not directly abut the metal pads on the substrate 72.

The metal pads on the substrate 72 may be grounded. The pads may also extend through the substrate 72 to terminate in the bottom pads 24 shown in FIG. 4. Such bottom pads 24 may then thermally contact a metal layer in a metal-core printed circuit board for additional heat sinking.

The heat sink 64 itself contains novel features. An array of segmented metal columns 76 is machined using conventional techniques to provide a large surface area for air cooling. A larger center protrusion 78, with a flat top, is provided to allow a robot arm or suction to grip the protrusion 78 and precisely mount the heat sink 64 on the bottom package 66 in an automated machine pick-and-place step.

In other embodiments, the upper package or other upper component may provide frequency isolation and/or shielding against RF, IF, or other radiated signal.

Multiple package structures may be formed simultaneously, and the packages are then singulated, such as by sawing.

In another embodiment, more than two packages may be vertically stacked using the techniques described above, where each upper package has leads that extend into laser drilled holes formed in its underlying package.

The technique described enables any degree of magnetic field isolation between the upper and bottom packages by providing a ground shield between the packages, or by providing adequate separation between the relevant components.

Instead of laser-drilling the holes, the holes may be formed by any other suitable method, such as during the molding of the bottom package, or mechanical drilling, or chemical etching.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A package structure comprising:
   a bottom package comprising:
      a substrate having a top surface and a metal contact pad on the top surface; and
      a molded layer over the top surface of the substrate, a laser-drilled hole formed at least partially through the molded layer to expose the metal contact pad, wherein an inner wall of the hole comprises the molded layer, the molded layer exposed at the hole; and
   an upper device mounted over the molded layer, the upper device having at least one component and a staple lead coupled to and extending away from the at least one component towards the substrate, the staple lead having a thickness and a width greater than the thickness, the staple lead being inserted through the hole to electrically or thermally connect to the metal contact pad, wherein the hole is wider than the staple lead.

2. The package structure of claim 1, further comprising circuitry on the substrate, the molded layer encapsulating the circuitry.

3. The package structure of claim 2, wherein the circuitry comprises switching circuitry electrically connected to the substrate.

4. The package structure of claim 1, further comprising a space between a sidewall of the hole and the staple lead.

5. The package structure of claim 1, further comprising a gap between an end of the staple lead and the metal contact pad, a conductive material disposed in the gap and providing an electrical or thermal connection between the staple lead and the metal contact pad.

6. The package structure of claim 5, wherein the conductive material comprises solder.

7. The package structure of claim 1, further comprising a plurality of staple leads including the staple lead and a second lead, the plurality of staple leads disposed about a perimeter of the upper device.

8. The package structure of claim 1, wherein the at least one component comprises at least one of an inductor, a transformer, a heat sink, and a device package.

9. The package structure of claim 1, wherein the substrate comprises a bottom surface opposite the top surface, the bottom surface comprising a plurality of pads to connect to an external device.

10. A package structure comprising:
a bottom molded package; and
an upper device mounted over the bottom molded package, the upper device having at least one component and a staple lead coupled to and extending away from the at least one component, the staple lead having a thickness and a width greater than the thickness, the staple lead extending at least partially through a hole comprising an exposed molded side wall of the bottom molded package to electrically or thermally connect to a metal contact pad, wherein the hole is wider than the staple lead.

11. The package structure of claim 10, wherein the bottom molded package comprises a substrate, circuitry on the substrate, and a molded layer over the substrate and the circuitry, wherein the staple lead is inserted into a hole in the molded layer to electrically or thermally connect to the metal contact pad, the metal contact pad disposed on a top surface of the substrate.

12. The package structure of claim 11, further comprising a space between a sidewall of the hole and the staple lead.

13. The package structure of claim 11, further comprising a gap between an end of the lead and the metal contact pad, a conductive material disposed in the gap and providing an electrical or thermal connection between the staple lead and the metal contact pad.

14. The package structure of claim 13, wherein the conductive material comprises solder.

15. The package structure of claim 10, further comprising a plurality of staple leads including the staple lead and a second staple lead, the plurality of staple leads disposed about a perimeter of the upper device.

16. A package structure comprising:
a bottom package comprising:
a substrate having a top surface and a metal contact pad on the top surface; and
a molded layer over the top surface of the substrate, a hole formed at least partially through the molded layer to expose the metal contact pad, an inner wall of the hole comprising the molded layer, the molded layer exposed at the hole, the hole terminating at the metal contact pad at a top layer of the substrate; and
an upper device mounted over the molded layer, the upper device having at least one component and a staple lead coupled to and extending away from the at least component towards the substrate, the staple lead having a thickness and a width greater than the thickness, the staple lead being inserted through the hole to electrically or thermally connect to the metal contact pad, wherein the hole is wider than the staple lead.

17. The package structure of claim 16, further comprising circuitry on the substrate, the molded layer encapsulating the circuitry, wherein the circuitry comprises switching circuitry electrically connected to the substrate.

18. The package structure of claim 16, further comprising a gap between an end of the staple lead and the metal contact pad, a conductive material disposed in the gap and providing an electrical or thermal connection between the staple lead and the metal contact pad.

19. The package structure of claim 16, further comprising a space between a sidewall of the hole and the staple lead.

* * * * *